| (12) | United States Patent | (10) Patent No.: | US 9,871,092 B2 |
|---|---|---|---|
| | Ookawara et al. | (45) Date of Patent: | Jan. 16, 2018 |

(54) DISPLAY DEVICE WITH REDUCED FRAME SIZE

(71) Applicant: Japan Display Inc., Tokyo (JP)

(72) Inventors: Takeshi Ookawara, Tokyo (JP); Toshihiro Sato, Tokyo (JP); Hiroshi Oooka, Tokyo (JP); Kouhei Takahashi, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 15/433,616

(22) Filed: Feb. 15, 2017

(65) Prior Publication Data

US 2017/0162645 A1 Jun. 8, 2017

Related U.S. Application Data

(63) Continuation of application No. 14/977,060, filed on Dec. 21, 2015, now Pat. No. 9,634,080, which is a continuation of application No. 14/161,717, filed on Jan. 23, 2014, now abandoned.

(30) Foreign Application Priority Data

Jan. 23, 2013 (JP) ................................. 2013-010224

(51) Int. Cl.
  *H01L 27/32* (2006.01)
  *H01L 51/52* (2006.01)

(52) U.S. Cl.
  CPC ...... *H01L 27/3276* (2013.01); *H01L 27/3253* (2013.01); *H01L 51/5234* (2013.01); *H01L 51/5237* (2013.01); *H01L 51/5246* (2013.01); *H01L 2251/5315* (2013.01)

(58) Field of Classification Search
  CPC ........................ H01L 27/3276; H01L 27/3253
  See application file for complete search history.

(56) References Cited

U.S. PATENT DOCUMENTS

| 2001/0043046 A1 | 11/2001 | Fukunaga |
| 2002/0140645 A1 | 10/2002 | Sato et al. |
| 2004/0135940 A1 | 7/2004 | Tsunekawa et al. |
| 2006/0145606 A1* | 7/2006 | Lee ..................... H01L 27/3276 |
| | | 313/509 |

(Continued)

FOREIGN PATENT DOCUMENTS

| JP | H10-223377 A | 8/1998 |
| JP | 2003-178878 A | 6/2003 |

(Continued)

OTHER PUBLICATIONS

Korean Office Action dated Feb. 11, 2015 for Korean Patent Application No. 2014-0006461 with partial translation.

(Continued)

*Primary Examiner* — Kyoung Lee
*Assistant Examiner* — Christina Sylvia
(74) *Attorney, Agent, or Firm* — Typha IP LLC (57) ABSTRACT

A display device includes contact holes opened in an insulating film outside of a display area in which pixels are arranged, and having a conductive film exposed in bottom portions, a first metal film formed to cover the contact holes and come in contact with the conductive film of the bottom portions, and a transparent conductive film formed on the first metal film.

7 Claims, 8 Drawing Sheets

(56) References Cited

U.S. PATENT DOCUMENTS

| | | | |
|---|---|---|---|
| 2009/0096371 A1 | 4/2009 | Matsudate et al. | |
| 2010/0133988 A1* | 6/2010 | Kim | H01L 27/3276 |
| | | | 313/504 |
| 2010/0156277 A1 | 6/2010 | Visser et al. | |
| 2010/0244057 A1 | 9/2010 | Ryu et al. | |
| 2010/0320895 A1* | 12/2010 | Lee | H01L 27/3244 |
| | | | 313/311 |
| 2011/0193102 A1 | 8/2011 | Nam et al. | |
| 2012/0199866 A1 | 8/2012 | Iwanari et al. | |

FOREIGN PATENT DOCUMENTS

| | | |
|---|---|---|
| JP | 2006-113568 A | 4/2006 |
| JP | 4205010 B2 | 1/2009 |
| JP | 2009-164107 A | 7/2009 |
| JP | 2010-165519 A | 7/2010 |
| JP | 2011-48973 A | 3/2011 |
| JP | 2011-108459 A | 6/2011 |

OTHER PUBLICATIONS

Wrzesniewshki E, Eom S, Hammond WT, Cao W, Xue J; Transparent oxide/metal/oxide trilayer electrode for use in top-emitting organic light-emitting diodes, J. Photon. Energy. 0001;1(1):011023-011023-9. dol:10.1117/1.3592886.

Japanese Office Action dated Nov. 15, 2016 for Japanese Patent Application No. 2013-010224 with partial translation.

Japanese Office Action dated Jun. 20, 2017 for corresponding JP Patent Application No. 2013-010224, with partial translation.

* cited by examiner

DISPLAY DEVICE WITH REDUCED FRAME SIZE

CROSS-REFERENCE TO RELATED APPLICATIONS

This application is a continuation of U.S. patent application Ser. No. 14/977,060 filed on Dec. 21, 2015, which, in turn, is a continuation of U.S. patent application Ser. No. 14/161,717 filed on Jan. 23, 2014. Further, this application claims priority from Japanese application No. 2013-010224 filed on Jan. 23, 2013, the contents of which are hereby incorporated by reference into this application.

BACKGROUND OF THE INVENTION

1. Field of the Invention

The present invention relates to a display device, and more particularly to a thin display device having thin film transistors formed on an insulating substrate.

2. Description of the Related Art

As display devices for information communication terminals such as a computer, or television receivers, flat display devices including a liquid crystal display device and an organic EL (electro-luminescent) display device have extensively been used. The liquid crystal display device is designed to change an orientation of a liquid crystal composition sealed between two substrates according to a change in electric field, and control a transmission degree of light that passes through those two substrates and the liquid crystal composition to display an image. On the other hand, the organic EL display device is designed to use a self-luminous body such as organic light emitting diodes. As compared with a related art liquid crystal display device, the organic EL display device is not only excellent in visibility and response speed, but also requires no auxiliary lighting device such as a backlight because a self-luminous body is used. For that reason, the organic EL display device can be thinned more than the liquid crystal display device.

JP-A-2011-108459 discloses a structure in which an oxide conductive film is laminated on an aluminum based alloy film containing Ag in a reflection anode electrode of the organic EL display device.

SUMMARY OF THE INVENTION

In recent years, particularly, in the flat display device used in mobile terminals, the device is required to be further downsized and thinned, and a frame area formed around a display area is required to be more reduced.

The present invention has been made in view of the above circumstances, and aims at providing a display device that reduces the frame area.

According to the present invention, there is provided a display device including: a display area in which pixels are arranged on a substrate; and a frame area that surrounds the display area, in which the display area includes: pixel circuits arranged for the respective pixels; an insulating film formed on the pixel circuits; pixel electrodes each connected to the pixel circuit through a through-hole formed in the insulating film; an organic layer arranged on the pixel electrodes, and including a light emitting layer; and a transparent conductive film arranged on the organic layer, in which the frame area includes: a conductive film; contact holes opened in the insulating film covering the conductive film, and continuously arranged from the display area to the frame area, and exposing the conductive film at bottom portions thereof; and a first metal film formed to cover the contact holes, and come in contact with the conductive film at the bottom portions, and in which the transparent conductive film is continuously arranged from the display area to the frame area, and formed on the first metal film.

Also, in the display device according to the present invention, the transparent conductive film may be formed of an electrode that covers the overall display area.

Also, in the display device according to the present invention, the first metal film may be formed only on the frame area, or cover the overall display area together with the transparent conductive film.

Also, according to the present invention, the display device may further include a second metal film formed on the transparent conductive film so as to cover the overall display area.

Also, in the display device according to the present invention, the contact holes may be discretely formed in a plurality of places outside of the display area, or formed outside of one of two pairs of opposed sides forming a rectangle of the display area.

Also, in the display device according to the present invention, the pixels formed in the display area may each have an organic light emitting layer that emits light by itself.

DETAILED DESCRIPTION OF THE INVENTION

Hereinafter, embodiments of the present invention will be described with reference to the accompanying drawings. In the drawings, identical or equivalent elements are denoted by the same reference numerals or symbols, and a repetitive description thereof will be omitted.

Figure 1:
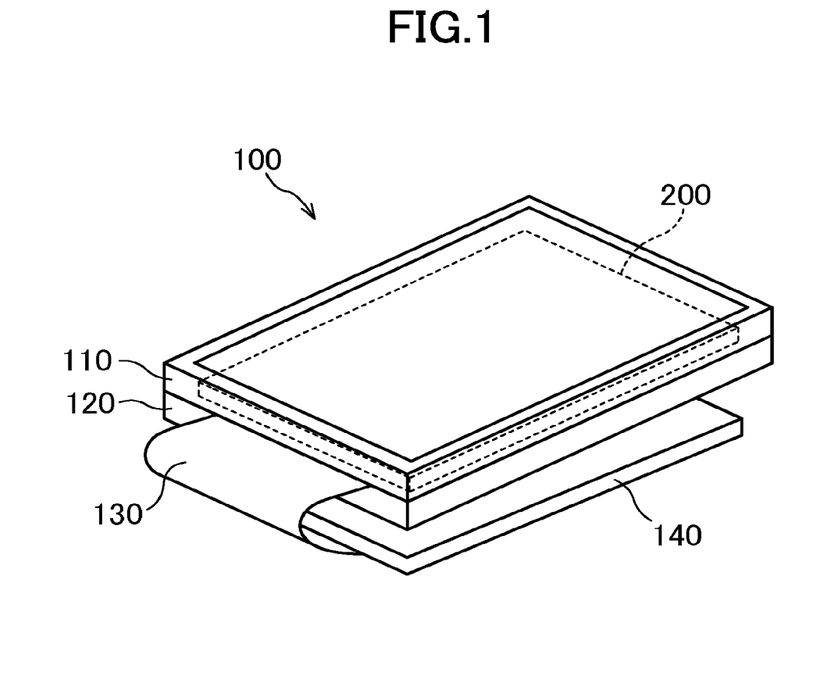
FIG. 1 is a diagram illustrating an organic EL display device according to an embodiment of the present invention.

FIG. 1 is a diagram illustrating an organic EL display device 100 which is a display device according to the embodiment of the present invention. As illustrated in the figure, the organic EL display device 100 includes an upper frame 110 and a lower frame 120 which are fixed to sandwich an organic EL panel 200 therebetween, a circuit substrate 140 having a circuit element for generating information to be displayed, and a flexible substrate 130 that transmits display information generated in the circuit substrate 140 to the organic EL panel 200.

Figure 2:
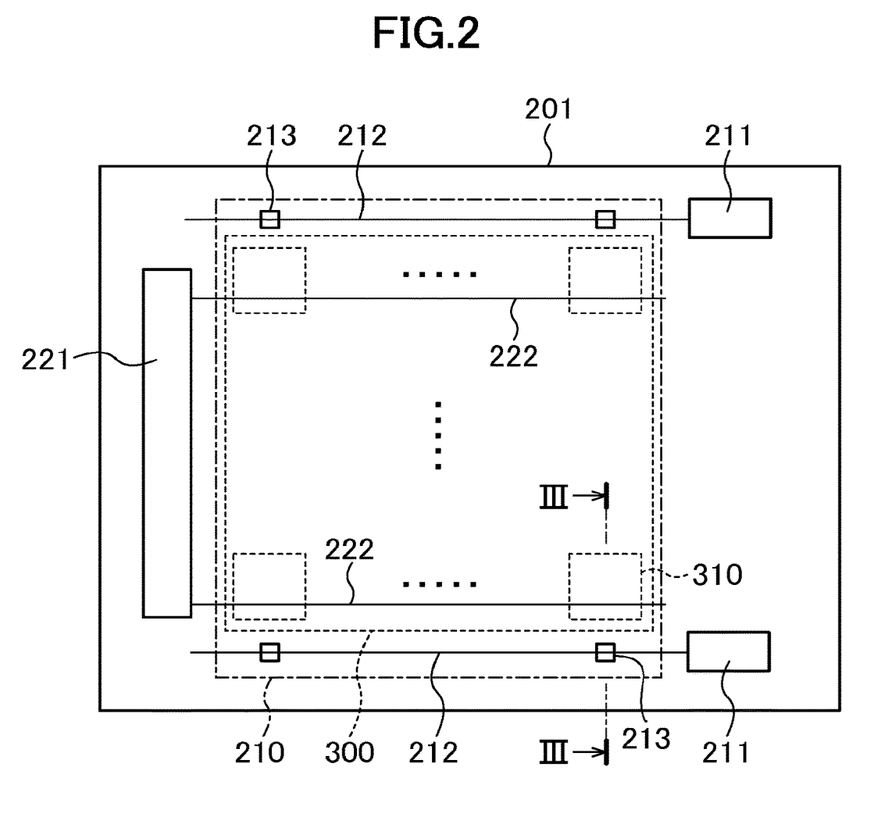
FIG. 2 is a schematic diagram illustrating a circuit formed on a glass substrate configuring an organic EL panel of FIG. 1.

FIG. 2 schematically illustrates a circuit formed on a glass substrate 201 configuring the organic EL panel 200 in FIG. 1. The glass substrate 201 includes a display area 300 in which pixels 310 each having an organic light emitting element are arranged in a matrix, data signal lines 222 that each transmit a data signal corresponding to a gray-scale value for display to an anode electrode of each pixel, a data signal driver circuit 221 that controls a voltage to be applied to the data signal lines 222, a cathode electrode film 210 which is cathode electrodes for each pixel, and arranged to cover the display area 300, and cathode voltage terminals 211 that each apply a cathode voltage to the cathode electrode film 210 through each of cathode electrode lines 212 and each of contact holes 213.

In this example, the contact holes 213 are formed outside of one of two pair of opposed sides forming the rectangular display area 300. As a result, the contact holes 213 are not formed outside of the other pair of opposed sides, and a frame area outside of the display area 300 can be reduced.

In this figure, the number of pixels 310 is omitted for preventing the figure from being complicated and the figure is simplified.

Figure 3:
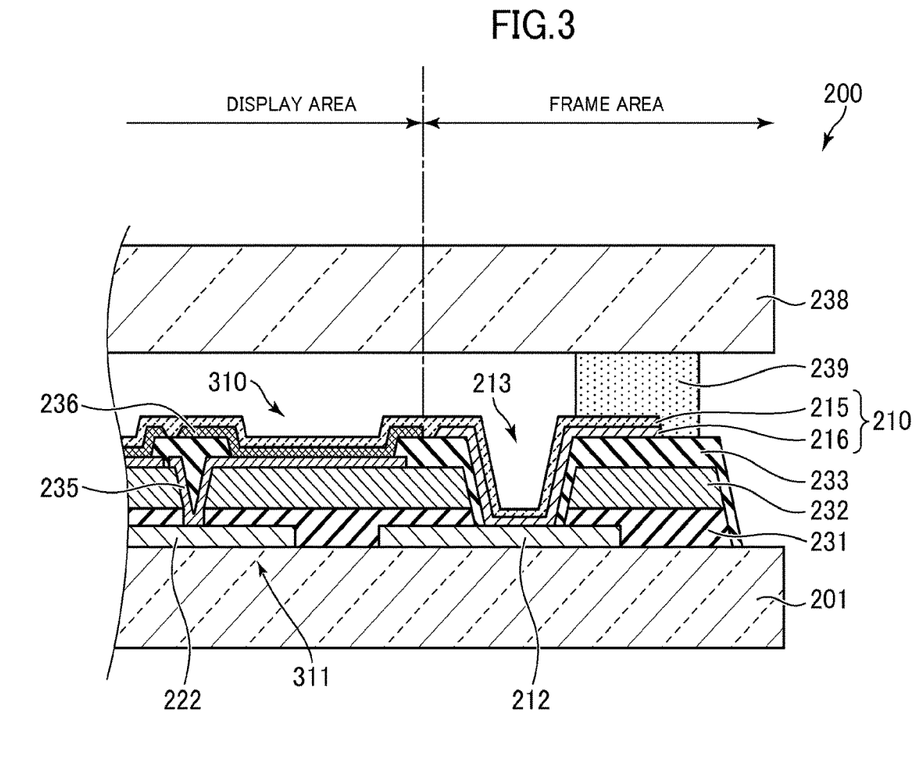
FIG. 3 is a cross-sectional view schematically illustrating the organic EL panel taken along a line of FIG. 2.

FIG. 3 schematically illustrates a cross-section of the organic EL panel 200 taken along a line in FIG. 2. As illustrated in the figure, the organic EL panel 200 has a circuit formed on the glass substrate 201, and is sealed by a sealing substrate 238 and a sealant 239 so as to prevent moisture from entering a periphery of the circuit. Also, the glass substrate 201 is formed with the display area in which the plurality of pixels is arranged, and the frame area surrounding the display area.

In the display area, a pixel circuit 311 arranged for each of the pixels, a flattened film 232 formed on the pixel circuit 311, a pixel electrode 235 connected to the pixel circuit 311, an organic layer 236 arranged on the pixel electrode 235, and a transparent conductive film 215 configuring the cathode electrode film 210 arranged on the organic layer 236 are arranged as a counter electrode. The pixel electrode is an anode to which a current is supplied. The flattened film 232 is a layer that separates a pixel electrode layer from a pixel circuit layer, and is formed of an insulating film. The pixel electrode 235 is connected to the pixel circuit through a through-hole formed in the flattened film 232. The organic layer 236 is formed in a single layer or a multilayer. In the case of the multilayer, the organic layer 236 includes a hole injection layer, a hole transport layer, a light emitting layer, an electron transport layer, and an electron injection layer. The counter electrode is a cathode electrode, formed of the transparent conductive film 215, and allows a light emitted from the light emitting layer to penetrate at a panel front surface side. An interlayer insulating film 231 is an insulating layer formed in the pixel circuit layer, and ensures insulation between the circuit and the wiring.

The cathode electrode line 212 that is a conductive film is formed in the frame area. The interlayer insulating film 231, the flattened film 232, and an interpixel insulating film 233 are formed of insulating films continuously arranged from the display area to the frame area. The insulating films are arranged to cover the conductive film in the frame area. The contact hole 213 is a hole formed for bringing the cathode electrode film 210 into contact with the cathode electrode lines 212. In this embodiment, the contact hole 213 is formed in films of the interlayer insulating film 231, the flattened film 232, and the interpixel insulating film 233. The pixel 310 is arranged so that the pixel electrode 235 connected to the data signal line 222 sandwiches the organic layer 236 in cooperation with the cathode electrode film 210. A current that flows due to a potential difference between the cathode electrode film 210 and the pixel electrode 235 causes the organic layer 236 to emit light. The emitted light penetrates through the cathode electrode film 210, and is displayed as an image for a user on the sealing substrate 238 side.

The cathode electrode film 210 according to this embodiment is formed by forming a metal film 216 and the transparent conductive film 215 in sequence. In this embodiment, the sealant 239 is arranged further outside of the contact holes 213. However, the sealant 239 may be formed to partially or entirely cover the contact hole 213.

Figure 7:
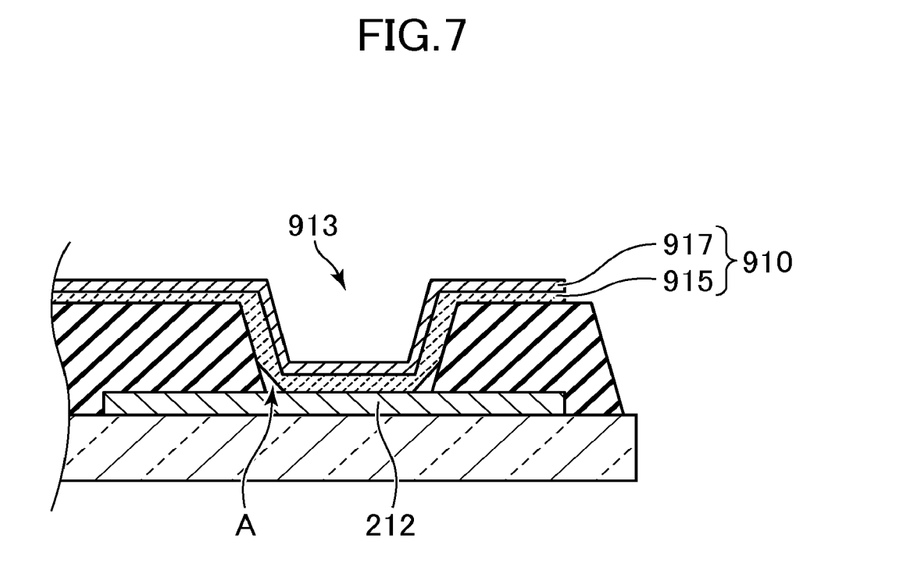
FIG. 7 is a cross-sectional view schematically illustrating contact holes according to a comparative example 1.

FIG. 7 is a cross-sectional view schematically illustrating a contact hole 913 according to a comparative example 1 for describing this embodiment. As illustrated in this figure, in the comparative example 1, a cathode electrode film 910 formed to cover the display area is formed by laminating a transparent electrode 915 and a metal film 917 in the contact hole 913 in sequence. The transparent electrode 915 is made of, for example, ITO (indium tin oxide) or InZnO, which is high in transparency, and also high in resistance value. Therefore, the metal film 917 that is, for example, a thin film made of Ag or Mg—Ag alloy which is low in the transparency and also low in the resistance value is formed on the transparent electrode 915, for the purpose of the higher transparency and the lower resistance value.

Figure 8:
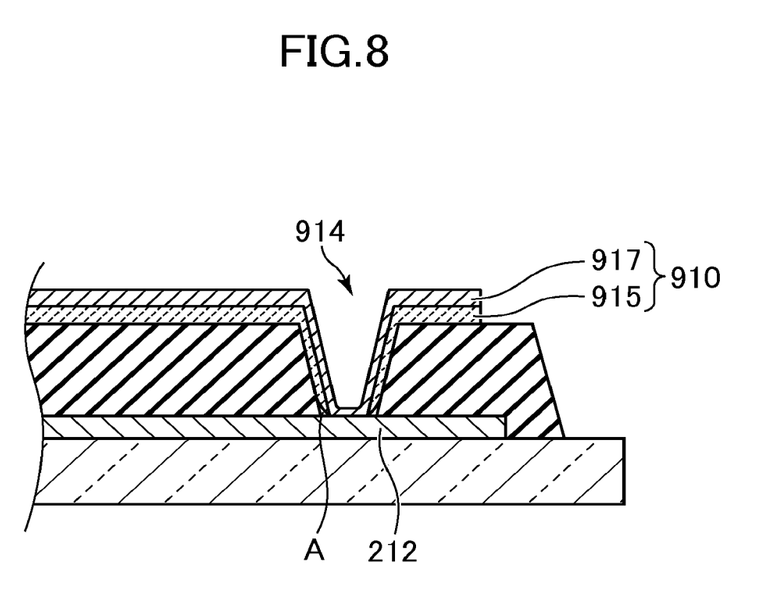
FIG. 8 is a cross-sectional view schematically illustrating contact holes according to a comparative example 2.

In this example, the transparent electrode 915 is formed by sputtering. However, according to the sputtering process, coating may sometimes be insufficient due to a difference in a shape of a step of the contact hole, or a coated material. A portion A in FIG. 7 represents a void which is a portion where the transparent electrode film does not sufficiently contact with the film of the contact hole 913. In the case of FIG. 7, the void is present, but an area of the portion where the transparent electrode 915 does not contact with the cathode electrode line 212 is sufficiently smaller than an area of a contact portion. Therefore, it is conceivable that the void hardly affects the operation of the display device. However, taking a reduction in the contact hole in order to reduce the frame area into account, as indicated by a contact hole 914 according to a comparative example 2 in FIG. 8, a rate of the area of the portion that does not contact with the cathode electrode line 212 becomes higher, and the higher resistance and also disconnection are conceivable. Also, even if the transparent electrode 915 contacts with the cathode electrode line 212 at the time of manufacturing, it is conceivable that the higher resistance or disconnection is issued due to use because the durability is low.

Figure 4:
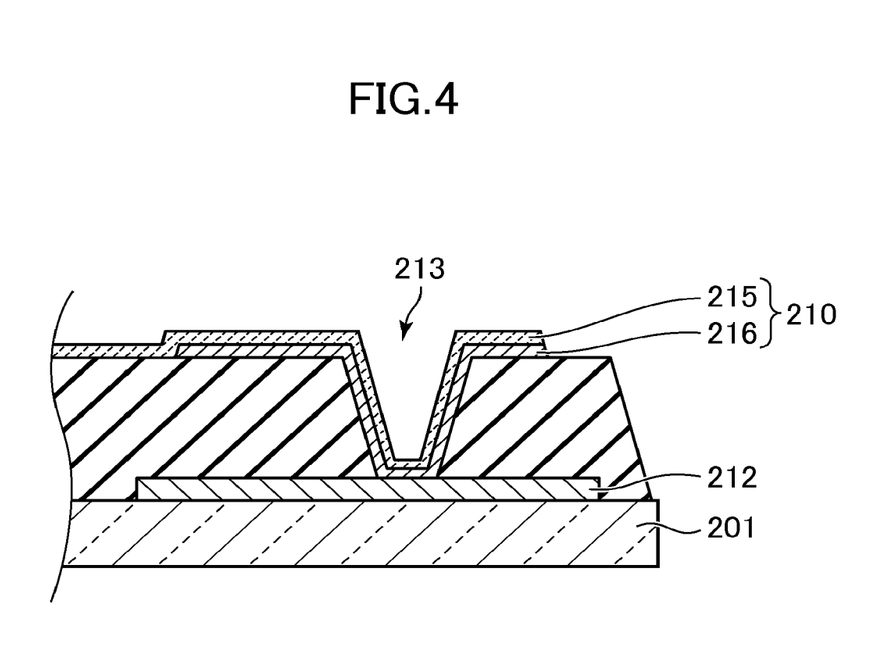
FIG. 4 is a schematic diagram illustrating film formation in the vicinity of contact holes in FIG. 2.

Under the circumstances, in this embodiment, as illustrated in FIG. 4, the metal film 216 and the transparent conductive film 215 are formed on the cathode electrode line 212 in the contact hole 213 in sequence. The metal film 216 is formed through a vacuum deposition method having an oblique component such as rotational film formation or oblique deposition. With this process, even if the cathode electrode lines 212 is sufficiently coated by the metal film 216, and an exposed area of the cathode electrode line 212 in the contact hole 213 is small, the cathode electrode line 212 is connected to the metal film 216 with a low resistance. In this embodiment, the metal film 216 does not cover the display area 300, but covers only the periphery of the contact hole 213, and only the transparent conductive film 215 formed on the metal film 216 covers the display area 300. In this case, the metal film 216 can be made of Ag or Mg—Ag alloy, but also opaque metal having a high melting point such as Al, Mg, or W. The transparent conductive film 215 is made of, for example, ITO or InZnO by sputtering.

Therefore, according to this embodiment, the line exposed in the bottom of the contact hole can be coated without the production of the void, and even if the area of the contact hole is reduced, the higher resistance and the disconnection can be prevented. As a result, because the area of the contact holes formed around the display area can be reduced, the frame area formed around the display area can be reduced. Also, because no void is generated, moisture and a chemical do not remain, and the degrading of a quality caused by diffusion of those remainders can be prevented, and the display device high in reliability can be provided.

Also, according to this embodiment, because the contact holes 213 are discretely formed in a plurality of places, even if a failure such as the disconnection occurs in any place, the contact holes 213 function in other places, to thereby enable the display device to operate.

Further, because the contact holes 213 are installed along one of two pairs of opposed sides, the frame area outside of the other pair of opposed sides can be reduced.

Figure 5:
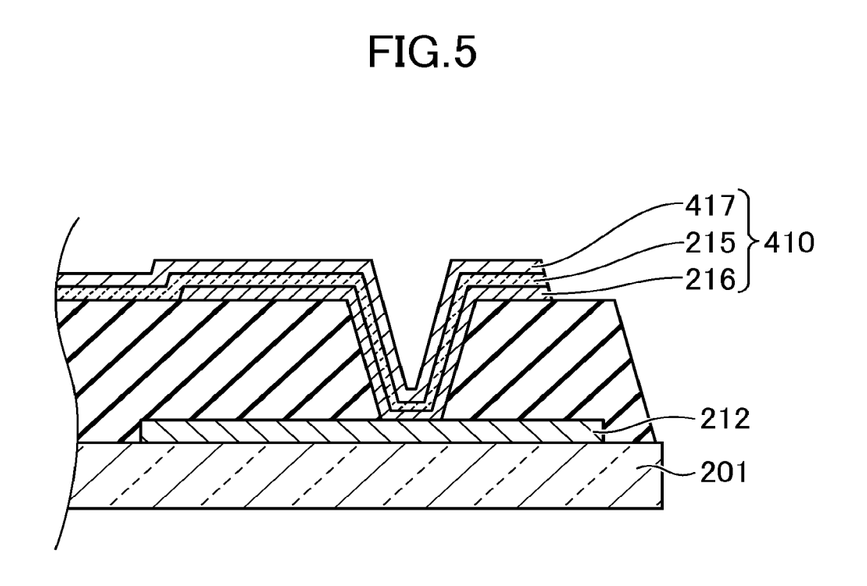
FIG. 5 is a diagram illustrating a first modified example of a cathode electrode film in FIG. 4.

FIG. 5 illustrates a cathode electrode film 410 that is a first modified example of the cathode electrode film 210 in FIG. 4. A difference from the cathode electrode film 210 resides in that a metal film 417 is further formed on the transparent conductive film 215. The metal film 417 is formed to cover the display area 300 together with the transparent conductive film 215. In this case, because the metal film 417 needs to have the transparency, it is desirable that the metal film 417 is formed of a thin film of Ag or Mg—Ag alloy. As a result, the resistance can be lowered particularly in the display area of the cathode electrode film 410.

Figure 6:
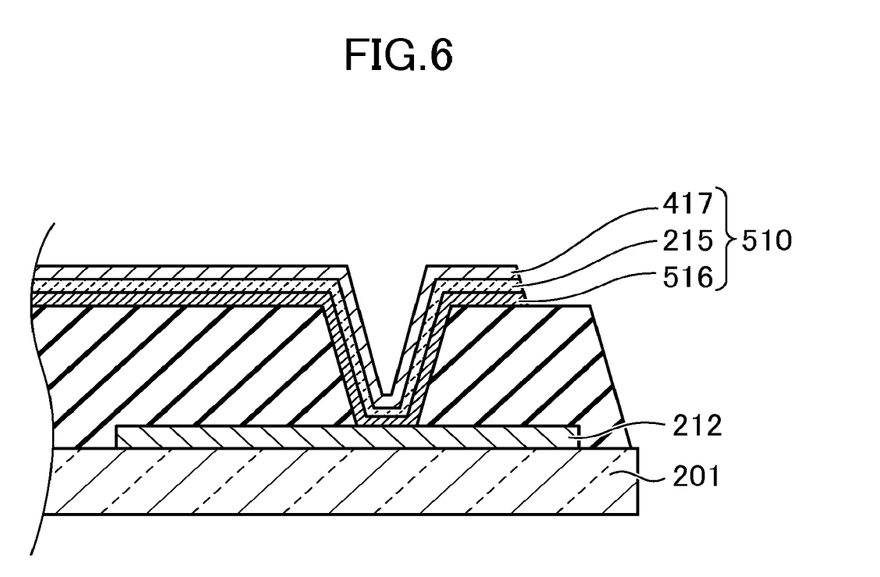
FIG. 6 is a diagram illustrating a second modified example of the cathode electrode film in FIG. 4.

FIG. 6 illustrates a cathode electrode film 510 which is a second modified example of the cathode electrode film 210. Differences from the cathode electrode film 210 in FIG. 4 reside in that the metal film 417 is further formed on the transparent conductive film 215 as in FIG. 5, and a metal film 516 formed below the transparent conductive film 215 covers the display area 300. Similarly, in this case, because the metal film 516 needs to have the transparency, it is desirable that the metal film 516 is formed of a thin film of Ag or Mg—Ag alloy. With the above configuration, the resistance can be further lowered in the display area of the cathode electrode film 510. Also, although not shown in the figure, only the metal film below the transparent conductive film 215 can be configured to cover the display area without formation of the metal film on the transparent conductive film 215.

In the above embodiment, the electrode connected by the contact hole is the cathode electrode film, but may be anode electrode, or an electrode defined by another expression.

Also, in the above-mentioned embodiment, a top emission type organic EL display device is exemplified. However, the present invention may be applied to a bottom emission type organic EL display device, another display device using self-emission display elements, or another display such as a liquid crystal display device.

While there have been described what are at present considered to be certain embodiments of the invention, it will be understood that various modifications may be made thereto, and it is intended that the appended claim cover all such modifications as fall within the true spirit and scope of the invention.

What is claimed is:

1. A display device comprising:
   a substrate having a display area including a plurality of pixels, and a frame area surrounding the display area;
   an organic insulating layer;
   a first metal layer;
   a transparent conductive layer; and
   a second metal layer, wherein
   each of the plurality of pixels comprises:
   a pixel electrode on the substrate;
   a portion of the organic insulating layer covering an edge of the pixel electrode and exposing an upper surface of the pixel electrode; and
   an organic layer including a light emitting material and covering the exposed upper surface of the pixel electrode,
   the frame area comprises:
   a conductive layer on the substrate; and
   another portion of the organic insulating layer covering an edge of the conductive layer and exposing an upper surface of the conductive layer,
   the first metal layer entirely covers the plurality of pixels and is in contact with the organic layer,
   the first metal layer extends from the display area to the frame area, and is in contact with the exposed upper surface of the conductive layer,
   the transparent conductive layer entirely covers the plurality of pixels, and is in contact with an upper surface of the first metal layer, and
   the second metal layer entirely covers the plurality of pixels, and is in contact with an upper surface of the transparent conductive layer.

2. The display device according to claim 1, wherein the transparent conductive layer extends from the display area to the frame area, and covers an area where the first metal layer and the exposed upper surface of the conductive layer are in contact with each other.

3. The display device according to claim 1, wherein the second metal layer extends from the display area to the frame area, and covers an area where the first metal layer and the exposed upper surface of the conductive layer are in contact with each other.

4. The display device according to claim 1, wherein the first metal layer has transparency.

5. The display device according to claim 1, wherein the second metal layer has transparency.

6. The display device according to claim 1, wherein the display area has a first, a second and a third side, which are located along outermost pixels of the plurality of pixels,
   the first side and the second side extend in a first direction,
   the third side extends in a second direction which intersects with the first direction,
   the first side and the second side are located at opposite sides of each other across the display area,
   the third side is located between the first side and the second side, and
   the conductive layer extends along the first side or the second side.

7. The display device according to claim 6, further comprising a driver circuit on the substrate, wherein the driver circuit is located along the third side.

* * * * *